United States Patent
Kim et al.

(10) Patent No.: US 8,059,483 B2
(45) Date of Patent: Nov. 15, 2011

(54) ADDRESS RECEIVING CIRCUIT FOR A SEMICONDUCTOR APPARATUS

(75) Inventors: Kyoung-Nam Kim, Ichon (KR); Ho-Youb Cho, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/834,429

(22) Filed: Jul. 12, 2010

(65) Prior Publication Data

US 2010/0278004 A1 Nov. 4, 2010

Related U.S. Application Data

(62) Division of application No. 11/961,963, filed on Dec. 20, 2007, now Pat. No. 7,755,969.

(30) Foreign Application Priority Data

May 14, 2007 (KR) .................. 10-2007-0046400

(51) Int. Cl.
*G11C 8/00* (2006.01)

(52) U.S. Cl. ........ 365/230.06; 365/233.1; 365/233.12; 365/233.14; 365/233.15

(58) Field of Classification Search .......... 365/230.06, 365/233.1, 233.12, 233.14, 233.15
See application file for complete search history.

(56) References Cited

U.S. PATENT DOCUMENTS

| | | | |
|---|---|---|---|
| 5,973,988 A * | 10/1999 | Nakahira et al. ........ 365/49.17 |
| 5,990,730 A | 11/1999 | Shinozaki |
| 6,064,627 A | 5/2000 | Sakurai |
| 6,178,126 B1 * | 1/2001 | Kirihata et al. ........ 365/200 |
| 6,256,240 B1 * | 7/2001 | Shinozaki ........ 365/201 |
| 6,337,833 B1 * | 1/2002 | Kanazashi et al. ........ 365/233.17 |
| 6,504,789 B2 * | 1/2003 | Hirakawa ........ 365/189.15 |
| 6,526,240 B1 | 2/2003 | Thomas et al. |
| 6,658,612 B1 | 12/2003 | Park et al. |
| 6,721,223 B2 * | 4/2004 | Matsumoto et al. ........ 365/222 |
| 6,744,687 B2 * | 6/2004 | Koo et al. ........ 365/226 |
| 6,853,317 B2 | 2/2005 | Kim et al. |
| 6,967,878 B2 * | 11/2005 | Dono ........ 365/200 |
| 7,042,800 B2 * | 5/2006 | Kang et al. ........ 365/189.14 |
| 7,102,958 B2 | 9/2006 | Lee et al. |
| 7,120,085 B2 | 10/2006 | Lee |
| 7,133,996 B2 * | 11/2006 | Ikeda et al. ........ 711/206 |
| 7,151,713 B2 * | 12/2006 | Nakazawa ........ 365/230.08 |
| 7,312,627 B2 | 12/2007 | An |
| 7,319,634 B2 | 1/2008 | Choo et al. |
| 7,434,120 B2 * | 10/2008 | Jang et al. ........ 714/718 |
| 7,453,753 B2 | 11/2008 | Chun |
| 7,486,575 B2 | 2/2009 | Park |
| 7,543,210 B2 | 6/2009 | Kim et al. |

FOREIGN PATENT DOCUMENTS

| | | |
|---|---|---|
| KR | 1019970012736 | 3/1997 |
| KR | 1020020088175 | 11/2002 |

* cited by examiner

*Primary Examiner* — Viet Nguyen
(74) *Attorney, Agent, or Firm* — Baker & McKenzie LLP

(57) ABSTRACT

An address receiving circuit for a semiconductor apparatus includes a controller that, in response to a semiconductor apparatus initialization-related command, generates a control signal having an activation cycle corresponding to the standard of cycle time of the semiconductor apparatus initialization-related command, and an address buffer that receives an address according to the control signal.

8 Claims, 3 Drawing Sheets

ADDRESS RECEIVING CIRCUIT FOR A SEMICONDUCTOR APPARATUS

CROSS-REFERENCE TO RELATED PATENT APPLICATION

This is a divisional application of application Ser. No. 11/961,963, filed Dec. 20, 2007 now U.S. Pat. No. 7,755,969, titled "Address Receiving Circuit for a Semiconductor Apparatus," which is incorporated herein by reference in its entirety as if set forth in full, and which claims priority under 35 U.S.C. 119(a) to Korean application number 10-2007-046400, filed on 14 May, 2007, in the Korean Patent Office, which is incorporated by reference in its entirety as if set forth in full.

BACKGROUND

1. Technical Field

The embodiments described herein relate to a semiconductor apparatus, and in particular, to an address receiving circuit for a semiconductor apparatus.

2. Related Art

As shown in FIG. 1, a conventional receiving circuit includes an address buffer 10, an MRS latch 20, and an MRS decoder 30.

The address buffer 10 receives a general address "A<0:13>" and a bank address "BA<0:1>" according to a clock signal "CK."

The MRS latch 20 latches an address "TLA<0:15>" output from the address buffer 10 in response to a pulse signal "MRS," which is generated according to an MRS (Mode Register Set) command. Since the MRS latch 20 must latch the entire address "TLA<0:15>" output from the address buffer 10, latches are provided by the number of bits of the address "TLA<0:15>."

The MRS decoder 30 decodes and outputs the address TLAD<0:15> latched by the MRS latch 20 according to the configuration settings information of the particular semiconductor operation mode that the semiconductor apparatus is set to. Examples of configuration settings include burst lengths (e.g., "BL4," "BL8," etc.), burst type "BTINT," CAS latency "CL<2:4>," and write recovery cycle.

The MRS command is input to initialize a semiconductor apparatus. The MRS command defines the standard of MRS command cycle time (tMRD) such that a prescribed time difference is created between an initial MRS command and a subsequent MRS command. In the case of DDR2 and DDR3, the tMRD defines 2 clocks and 4 clocks.

In a conventional semiconductor apparatus, in order to latch an address input according to the MRS command, the number of latches provided need to match the number of bits of the address. Therefore, a large design layout area is required for the latches.

Even if the address is not input until a successive MRS command is input after the initial MRS command input, the clock may be toggled to latch the address, which can result in unnecessary power consumption.

SUMMARY

An address receiving circuit for a semiconductor apparatus that can reduce a layout area is described herein. An address receiving circuit for a semiconductor apparatus that can reduce power consumption, is also disclosed.

In one aspect, an address receiving circuit can include a controller that, in response to a semiconductor apparatus initialization-related command, generates a control signal having an activation cycle corresponding to the standard cycle time of the semiconductor apparatus initialization-related command, and an address buffer that receives an address according to the control signal.

According to another aspect, an address receiving circuit for a semiconductor apparatus includes a controller and an address buffer. The controller outputs a control signal when the semiconductor apparatus is initialized, then inactivates for a predetermined period, and after the initialization, outputs a control signal, which has the same cycle as a clock. The address buffer receives an address according to the control signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
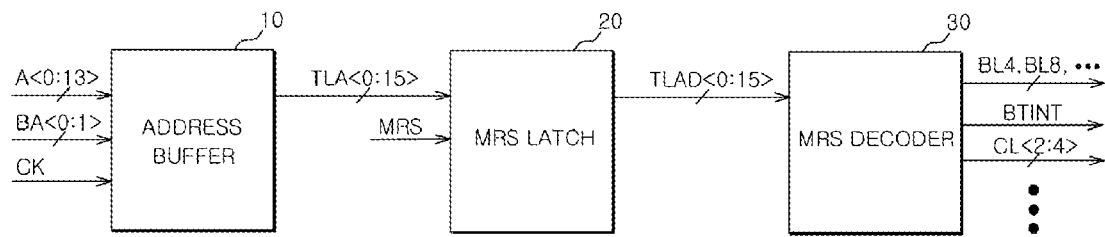
FIG. 1 is a block diagram showing an exemplary address receiving circuit for a semiconductor apparatus.
Figure 2:
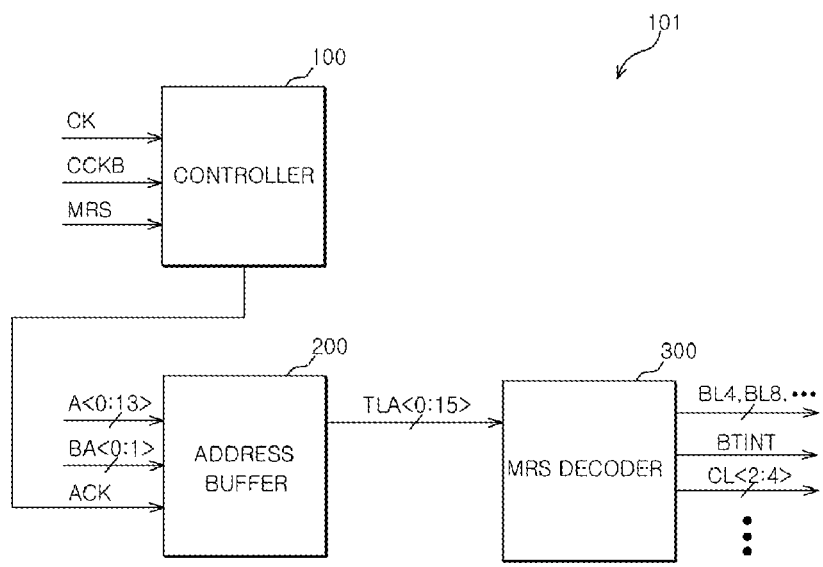
FIG. 2 is a block diagram showing in detail an example address receiving circuit for a semiconductor apparatus according to one embodiment.

FIG. 2 is a diagram illustrating an example address receiving circuit 101 configured in accordance with one embodiment. As shown in FIG. 2, the address receiving circuit 101 can include, a controller 100, an address buffer 200, and a MRS decoder 300.

The controller 100 can be configured to generate a control signal "ACK" having the same cycle as a clock signal "CK" during a normal operation of the semiconductor apparatus. In addition, the controller 100 can determine whether or not a pulse signal "MRS" generated according to an MRS (Mode Register Set) command is activated, and outputs the control signal "ACK" while changing its activation cycle during an initialization period of the semiconductor apparatus.

The address buffer 200 can be configured to receive addresses "A<0:13>" and "BA<0:1>" according to the control signal ACK.

The MRS decoder 300 can be configured to decode and output the address "TLA<0:15>" output from the address buffer 200 using the configuration settings of the semiconductor operation modes. Examples, of configuration setting information that may be defined on the semiconductor operation modes include, but are not limited to, burst lengths (e.g., "BL4," "BL8," etc.), a burst type BTINT, a CAS latency "CL<2:4>," and a write recovery cycle.

Furthermore, the controller 100 can be configured to change the activation cycle of the control signal "ACK" according to the standard cycle time of the pulse signal "MRS" when the pulse signal "MRS" is activated. The controller 100 can change the activation cycle of the control signal "ACK" by preventing a change in level for a time corresponding to the standard of MRS command cycle time (tMRD) when the pulse signal "MRS" is activated.

Figure 3:
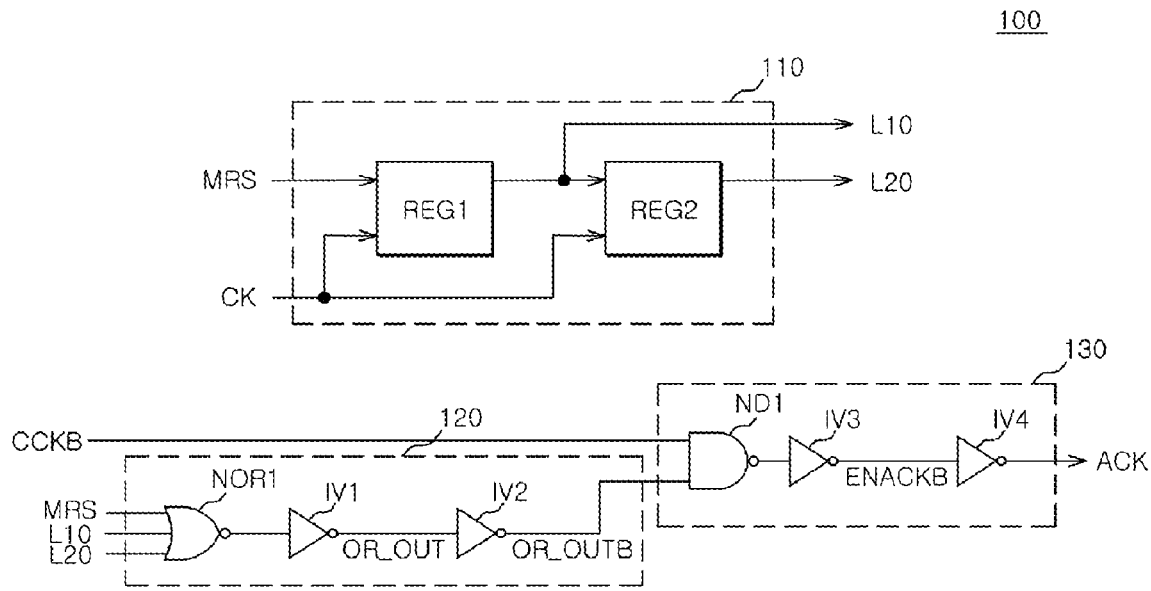
FIG. 3 is a circuit diagram showing a controller that can be included in the circuit shown in FIG. 2.

As shown in FIG. 3, in one embodiment, the controller 100 can include, a timing signal generator 110, a period signal generator 120, and a control signal generator 130. As depicted herein for this controller 100, the standard of MRS command cycle time (tMRD) defines 4 clocks.

The timing signal generator 110 can be configured to sequentially shift the pulse signal "MRS" by a prescribed time to generate a plurality of timing signals "L10" and "L20." The timing signal generator 110 can include a plurality of shift registers REG1 and REG2 that receive the pulse signal "MRS" and can sequentially shift the received pulse signal "MRS" according to the clock signal "CK." In one embodiment, each of the shift registers REG1 and REG2 can be configured to shift an input signal by one clock. In another embodiment, a shift time can be set to, for example, 1/2 clock. It should be appreciated, however, that the shift registers (e.g., REG1 and REG2) can be configured to shift the input signal by any clock cycle as long as the resulting timing signals can be processed by the period signal generator 120.

The period signal generator 120 can be configured to perform a logical operation on the pulse signal "MRS," which is generated according to the MRS command, and the plurality of timing signals "L10" and "L20," to thereby generate a period signal. The period signal generator 120 can include a NOR gate (i.e., NOR1) that receives the pulse signal MRS and the plurality of timing signals "L10" and "L20," a first inverter (i.e., IV1) that receives an output of the NOR gate NOR1, and a second inverter (i.e., IV2) that receives an output of the first inverter IV1 and outputs a period signal "OR_OUTB."

The control signal generator 130 can be configured to generate the control signal "ACK" using the period signal "OR_OUTB" and an inverted clock signal "CCKB." The control signal generator 130 can include a NAND gate (i.e., ND1) that receives the inverted clock signal "CCKB" and the period signal "OR_OUTB," a third inverter (i.e, IV3) that receives an output of the NAND gate ND1, and a fourth inverter (i.e., IV4) that receives an output of the third inverter IV3 and outputs the control signal "ACK." The inverted clock signal "CCKB" can be generated by delaying the clock signal "CK" in the semiconductor apparatus for a predetermined time and inverting the delayed clock signal.

Figure 4:
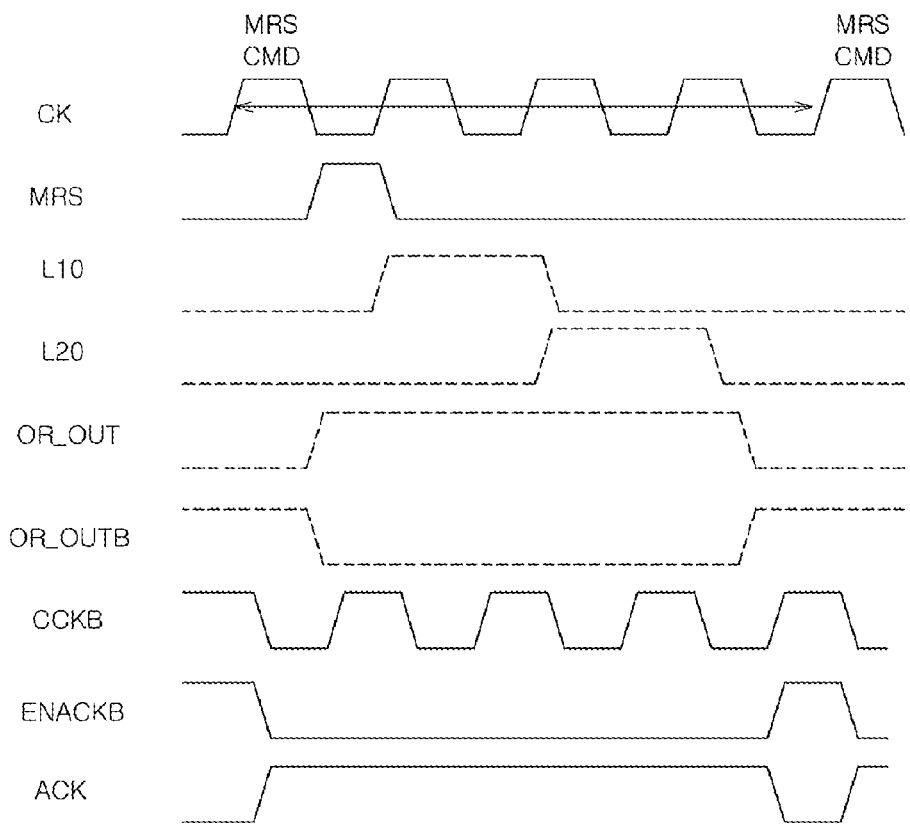
FIG. 4 is a timing diagram illustrating the operation of the address receiving circuit of FIG. 2.

Various embodiments of the operation of the address receiving circuit for a semiconductor apparatus having the above-described configuration will now be described with reference to FIG. 4.

First, the MRS command can be input during the initialization process of the semiconductor apparatus. For example, during the initial operation of the semiconductor apparatus, the MRS command can be input two or more times according to the type and the operation standard of the semiconductor apparatus with a cycle time according to the standard of MRS command cycle time (tMRD). In addition to the MRS command inputs, addresses "A<0:13>" and "BA<0:1>," in which the configuration settings of the semiconductor operation modes are encoded, can also be input. For example, after the MRS command, addresses "A<0:13>" and "BA<0:1>" for an active command (such as a read command or a write command), are input.

In an apparatus that controls the semiconductor apparatus, such as a GPU (Graphic Processing Unit) or a CPU (Central Processing Unit), if the MRS command is input, a pulse signal "MRS" can be generated in the semiconductor apparatus.

If the pulse signal MRS is generated, the timing signal generator 110 shown in FIG. 3 can be configured to shift the pulse signal "MRS" to generate timing signals "L10" and "L20."

The period signal generator 120 shown in FIG. 3 can be configured to perform a logical OR operation on the pulse signal "MRS" and the timing signals "L10" and "L20," and invert the result value of the logical OR operation to generate the period signal "OR_OUTB."

The control signal generator 130 shown in FIG. 3 can be configured to perform a logical AND operation on the period signal "OR_OUTB" and the inverted clock signal "CCKB," and invert the result value of the logical AND operation to generate the control signal "ACK."

The control signal "ACK" can be used to allow the address buffer 200 shown in FIG. 2 to receive the addresses "A<0:13>" and "BA<0:1>." It is assumed that the address buffer 200 receives the addresses "A<0:13>" and "BA<0:1>" when the control signal "ACK" is at a low level. The control signal "ACK" is maintained at a high level, without being not changed to the low level, for a period according to the standard of MRS command cycle time (tMRD) starting with a clock pulse of the clock signal "CK" corresponding to the pulse signal "MRS," that is, for a time corresponding to four clock pulses.

The address buffer 200 can be configured to receive and output the addresses "A<0:13>" and "BA<0:1>," which are input together with the initial MRS command, when the control signal "ACK" is at the low level.

The MRS decoder 300 can be configured to decode the address "TLA<0:15>" output from the address buffer 200 using the configuration settings information of the particular semiconductor operation mode that the semiconductor apparatus is set to. The operation mode of the semiconductor apparatus can be set according to the output setting information.

The address buffer 200 does not receive the addresses "A<0:13>" and "BA<0:1>" when the control signal "ACK" is maintained at a high level without being toggled. When the control signal "ACK" is maintained at the high level without being toggled, the address buffer 200 can be configured to wait for a next MRS command. At this time, the addresses "A<0:13>" and "BA<0:1>" for the active command, such as the read command or the write command, are also not input.

Accordingly, addresses "A<0:13>" and "BA<0:1>" according to the MRS command can be input when the control signal "ACK" is at a low level when the initial MRS command is input. Then, the control signal is maintained at the high level until the next MRS command is input, and is at the low level again when the next MRS command is input. Then, the addresses "A<0:13>" and "BA<0:1>" according to the next MRS command can be input. The control signal "ACK" is maintained at the high level, without being toggled, until the next MRS command is input, thereby reducing power consumption.

Meanwhile, after the MRS command and the addresses "A<0:13>" and "BA<0:1>" according to the MRS command are input, and the operation mode of the semiconductor apparatus is set, the addresses "A<0:13>" and "BA<0:1>" for the active command, such as the read command or the write command, are input.

While the addresses "A<0:13>" and "BA<0:1>" for the active command are input, the pulse signal MRS according to the MRS command is not generated. Since the pulse signal MRS is not generated, the timing signals "L10" and "L20" and the period signal "OR_OUTB" are maintained at the low level, and the control signal "ACK" is output to have the same waveform as the clock signal "CK."

Figure 5:
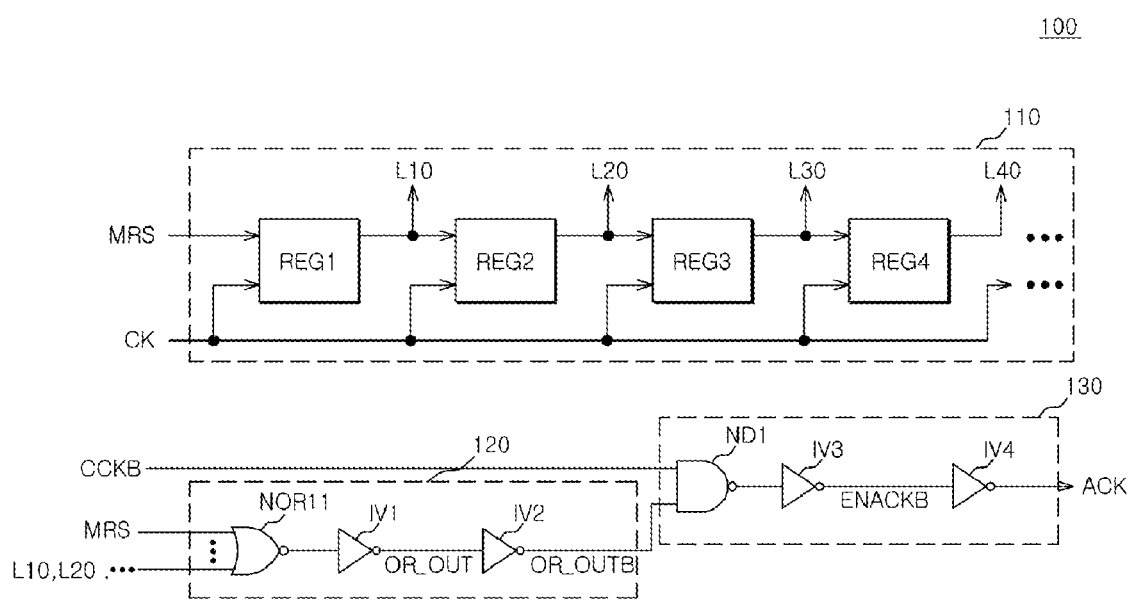
FIG. 5 is a circuit diagram showing in detail another example controller that can be included in the circuit shown in FIG. 2.

FIG. 5 shows another embodiment of controller 100. In the controller 100 shown in FIG. 3, the standard of MRS command cycle time (tMRD) defines 4 clocks, whereas, in the controller 100 shown in FIG. 5, the standard of MRS command cycle time (tMRD) defines N clocks.

For example, when the standard of MRS command cycle time (tMRD) defines 5 clocks, the timing signal generator 100 can include three shift registers REG1, REG2, and REG3 to output timing signals "L10," "L20," and "L30." When the standard of MRS command cycle time (tMRD) defines 6 clocks, the timing signal generator 100 includes four shift registers REG1, REG2, REG3, and REG4 to output timing signals "L10," "L20," "L30," and "L40." That is, when the standard of MRS command cycle time (tMRD) defines N clocks, the timing signal generator 100 can include (N-2) shift registers (e.g., REG1, REG2, REG3, REG4, etc. . . . ) to output (N-2) timing signals (e.g., "L10," "L20," "L30," "L40," etc. . . . ).

As the number of shift registers in the timing signal generator 110 varies, a NOR gate NOR11 of the period signal generator 120 is configured to likewise have the input terminals determined by the number of timing signals (e.g., L10, L20, L30, L40, etc. . . . ) received.

It should be appreciated, however, that FIG. 3 and FIG. 5 depict just two embodiments of controller 100 and are not intended to limit the variations in design of controller 100 that may be used with the present invention in any way. Controller 100 may be modified to meet the requirements of the particular application that the semiconductor apparatus is applied to and still fall within the scope of the present invention; limited only by the constraint that the resulting design improves the power consumption profile and/or size of the resultant semiconductor apparatus over the related art previously discussed. Moreover, the above description of these two embodiments are based on an assumption that each shift register shifts the input signal by one clock. The number of shift registers may vary according to the shift time of the individual shift registers.

In certain embodiments of the address receiving circuit for a semiconductor apparatus, a latch that stores the address according to the MRS command is not needed. Accordingly, the area can be reduced, and thus the layout margin can be increased. Furthermore, since the clock is not toggled to latch the address until the next MRS command is input after the initial MRS command is input, unnecessary power consumption can be prevented.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An address receiving circuit for a semiconductor apparatus, comprising:
    a controller that outputs a control signal inactivated during a predetermined period when a semiconductor apparatus is initialized, and outputs a control signal having the same cycle as a clock after the initialization; and
    an address buffer that receives an address according to the control signal.

2. The address receiving circuit of claim 1, wherein the controller is configured to change the predetermined period of the control signal according to a prescribed time difference between an initial MRS (Mode Register Set) command and a subsequent MRS command when an MRS command is activated.

3. The address receiving circuit of claim 1, wherein the controller is configured to stop a level transiting of the control signal during the predetermined period.

4. The address receiving circuit of claim 1, wherein the controller includes:
    a timing signal generator that sequentially shifts an MRS command to generate a plurality of timing signals;
    a period signal generator that performs a logical operation on the MRS command and the plurality of timing signals to generate a period signal; and
    a control signal generator that generates the control signal using the period signal and a clock signal.

5. The address receiving circuit of claim 4, wherein the timing signal generator includes a plurality of shift registers that receive and sequentially shift the MRS command.

6. The address receiving circuit of claim 5, wherein a number of the plurality of shift registers is determined according to a prescribed time difference between an initial MRS command and a subsequent MRS command.

7. The address receiving circuit of claim 4, wherein the period signal generator includes a logic circuit that performs a logical OR operation on the plurality of timing signals and inverts a result value of the logical OR operation.

8. The address receiving circuit of claim 4, wherein the control signal generator includes a logic circuit that performs a logical AND operation on the period signal and an inverted clock signal, and inverts a result value of the logical AND operation.

* * * * *